(12) United States Patent
Hammel et al.

(10) Patent No.: US 6,191,944 B1
(45) Date of Patent: Feb. 20, 2001

(54) HEAT SINK FOR ELECTRIC AND/OR ELECTRONIC DEVICES

(75) Inventors: Ernst Hammel; Hermann Holzer, both of Vienna (AT)

(73) Assignee: Electrovac, Fabrikation elektrotechnischer Spezialartikel Gesellschaft m.b.H., Klosterneuburg (AT)

( * ) Notice: Under 35 U.S.C. 154(b), the term of this patent shall be extended for 0 days.

(21) Appl. No.: 09/187,574

(22) Filed: Nov. 5, 1998

(51) Int. Cl.[7] ........................................ H05K 7/20
(52) U.S. Cl. .................. 361/699; 361/703; 361/704; 361/709; 361/717; 361/718; 257/706; 257/707; 257/714; 174/16.3; 165/80.4; 165/104.33
(58) Field of Search ...................... 361/390–695, 361/698, 699, 700, 704–710; 257/706, 712–715; 174/15.1, 15.2, 16.3; 165/80.2, 80.3, 80.4, 185

(56) References Cited

U.S. PATENT DOCUMENTS

| 3,706,127 | * | 12/1972 | Oktay et al. ................. 438/3 |
| 4,593,661 | * | 6/1986 | Brander ...................... 123/196 AB |
| 4,612,601 | * | 9/1986 | Watari ........................ 361/704 |
| 5,368,094 | * | 11/1994 | Hung ........................... 165/80.3 |
| 5,858,537 | * | 1/1999 | Brown et al. ................. 428/408 |

FOREIGN PATENT DOCUMENTS

| 046 605 A2 | * | 3/1982 | (EP) . |
| 718 883 A3 | * | 11/1990 | (EP) . |
| 362024730 | * | 2/1987 | (JP) . |
| 90/12769 | * | 11/1990 | (WO) . |

OTHER PUBLICATIONS

Römpp Chemical Dictionary 9, expanded and revised edition, by Prof. Dr. Jürgen Falbe and Prof. Dr. Manfred Regitz, Georg Thieme Verlag Stuttgart–N.Y., vol. 6, p. 5039.

"Whisker Technology", New York 1970, by A. P. Levitt, publishing house Wiley–Interscience.

"Transactions of the Metallurgical Society of AIME (The Vapor–Liquid–Solid Mechanism of Crystal Growth and Its Application to Silicon), vol. 233, Jun. 1965, pp. 1053–1064".

"VLSI Technology", sec. Ed by S. M. Sze, McGraw–Hill International editions, New York, N.Y. 1988, pp. 200–204.

* cited by examiner

Primary Examiner—Leo P. Picard
Assistant Examiner—Boris Chervinsky
(74) Attorney, Agent, or Firm—Henry M. Feiereisen

(57) ABSTRACT

A heat sink adapted for use with an electrical and/or electronic device, in particular with a semiconductor chip such as an integrated circuits, or with a casing for such a device, is formed from a material including whiskers.

10 Claims, 1 Drawing Sheet

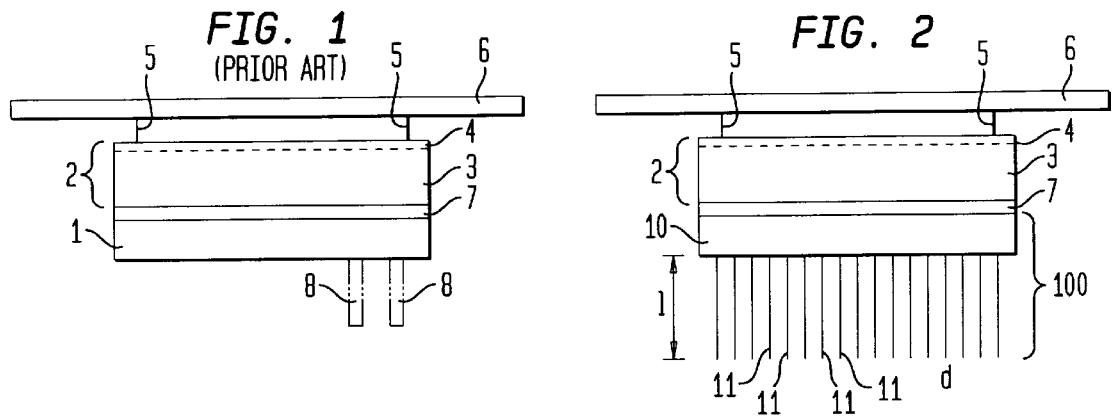
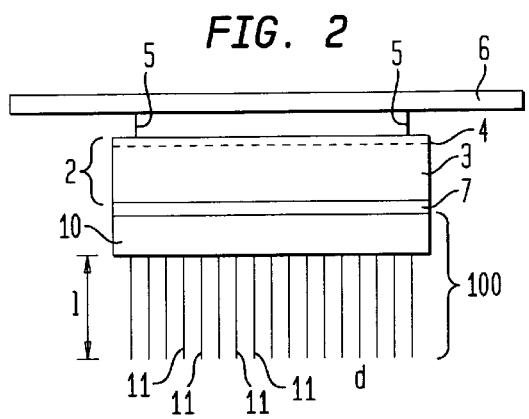
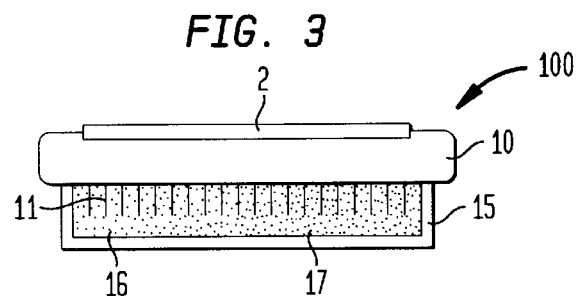
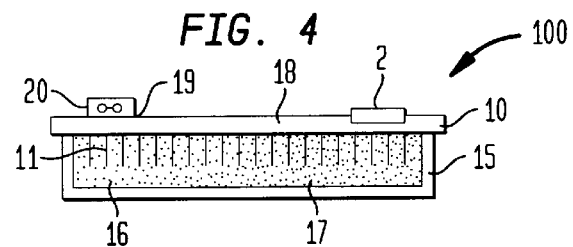
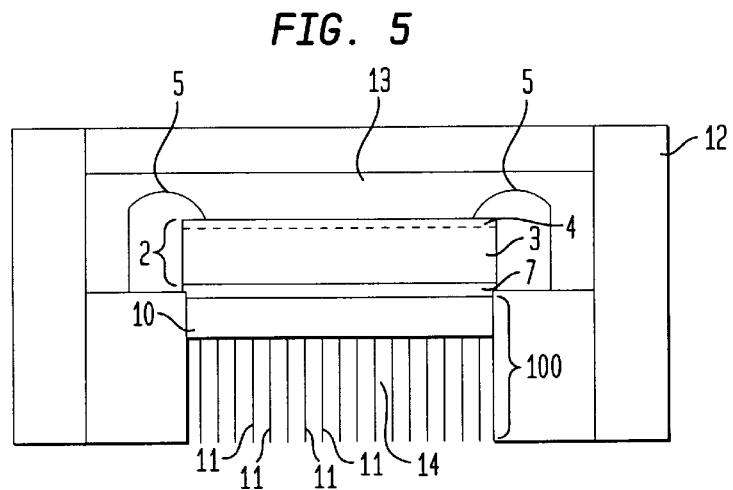

HEAT SINK FOR ELECTRIC AND/OR ELECTRONIC DEVICES

BACKGROUND OF THE INVENTION

The present invention relates to a heat sink for eliminating heat produced by a device such as an electrical and electronic device, in particular a semiconductor chip such as an integrated circuits, or a casing for such an electric/electronic device.

To date, a conventional cooling apparatus or heat sink is made of metals, metal alloys, metal composites or the like. Concrete examples of materials include aluminum and metal matrix composites. In order to be able to radiate heat produced by the device being cooled as rapidly and completely as possible to the surrounding environment, the heat sink should exhibit a greatest possible contact surface towards the ambient atmosphere. To meet this requirement, conventional heat sinks are formed with a number of contoured areas such as ribs, knobs or like so that the heat sinks receive a relatively large surface at comparable small mass. Still, metallic heat sinks of this type have the drawback of a significant mass and size. Moreover, it should also be taken into consideration that the performance of electronic components steadily increases in modern microelectronics, resulting in an increased production of dissipated heat to be eliminated. At the same time, the mentioned power increase is accompanied by a desire to minimize the size of the components.

In order to reliably and effectively carry away increasing amounts of lost heat by use of a heat sink of the above-stated type, this heat sink must be dimensioned of relatively great size and volume, resulting in greater geometric sizes of the electric and/or electronic devices which incorporate the component to be cooled so that the achievements of the microelectronics, namely the manufacture of particularly small and thus practical devices (e.g. mobile telephones or portable computers) by means of especially small and powerful components are defeated.

SUMMARY OF THE INVENTION

It is thus an object of the present invention to provide an improved heat sink, obviating the afore-stated drawbacks.

In particular, it is an object of the present invention to provide an improved heat sink which is capable to efficiently absorb dissipated heat generated in particular by semiconductor chips.

These objects, and others which will become apparent hereinafter, are attained in accordance with the present invention by forming the heat sink from a material including whiskers.

Through the provision of whiskers, that heat sink is provided with an especially large surface to enable a particularly rapid radiation of dissipated heat from the heat sink to the ambient atmosphere.

Suitably, the material of the heat sink is identical to the material of the component being cooled. Thus, the coefficient of thermal expansion between heat sink and component being cooled are matched, thereby preventing tensions in the joint between the component and heat sink and effectively eliminating the risk of detachment of the heat sink from the component as a result of temperature fluctuations.

Preferably, the heat sink has a substrate in heat conductive connection with the component being cooled, whereby the whiskers grow on the substrate. A substrate which has whiskers can be effectively and easily connected in a heat conductive manner with the component being cooled.

According to a further feature of the invention, the substrate as well as the whiskers are each made of a semiconductor material.

In practice, e.g. in modern microelectronics, electronic components to be cooled are frequently made of a semiconductor material. A heat sink formed from a semiconductor material is especially suitable for attachment to such components because of matching coefficients of thermal expansion between the heat sink and the component itself. The heat sink can thus be directly attached to the component being cooled, without risking development of tensions in the joint between the component and the heat sink as a result of temperature fluctuations. Suitably, the whiskers are so dimensioned that the ratio of length to diameter of the whiskers is greater than 10. These geometric dimensions impart the heat sink with a particularly large surface and thus with particularly good heat dissipation properties.

Preferably, a cover is affixed to the substrate to at least partially envelope the whiskers, whereby the substrate and the cover form a space which is filled, at least partially, with a liquid, such as water or alcohol. Thus, the whiskers are in particular capable to eliminate heat absorbed from the component being cooled so that the overall efficiency of the heat sink according to the invention is improved.

According to another feature of the present invention, the heat sink has a first zone for attachment of the component being cooled, and a second zone which is capable of being cooled. The heat sink according to the invention can thus be operated as so-called "heat pipe", i.e, the liquid is vaporized by heat emitting from the component being cooled, whereby this vapor is moved to the coolable zone of the heat sink to condense there as a result of a cooling action taking place there. By this system, heat can be carried away particularly efficiently from the component being cooled.

Suitably, the area of coolable zone of the heat sink is provided with a fan. This apparatus is of very simple structure and commercially available as a standard piece so that the use of a fan for cooling the heat sink realizes in a particularly simple and cost-efficient manner the above-mention "heat pipe function".

According to still another feature of the invention, the component to be cooled is a semiconductor chip, such as an integrated circuit, with the heat sink being affixed eutectically upon the semiconductor chip. The provision of a eutectic joint produces a particularly good heat conducting connection between the component being cooled and the heat sink because the joint is largely made from the material of the heat sink, so as to realize as a whole a particularly efficient transport of the dissipated heat from the component to the ambient atmosphere.

It is a further object of the invention to provide a casing for an electric and/or electronic device which has attached thereon a heat sink, with the casing being so constructed as to minimize the impact on the heat transfer from heat sink to the ambient atmosphere.

In accordance with the present invention, this object is attained by providing the casing with an opening in which the heat sink is received at least partially, preferably in its entirety.

Thus, the heat sink is in direct contact to the ambient atmosphere, enabling a direct transfer of lost heat thereto. Consequently, a significant deterioration of the heat transfer efficiency resulting from a multi-staged heat transfer from heat sink to the casing atmosphere, from there to the casing material and from there to the ambient atmosphere, is prevented. Still, the heat sink is effectively protected by the casing from mechanical impacts.

Suitably, the heat sink is made of a semiconductor material. As stated above, the advantages of such a heat sink reside primarily in the fact that the coefficient of thermal expansion of the component to be cooled and oftentimes also made of semiconductor material and the coefficient of thermal expansion of the heat sink are very much alike so that the heat sink can be positioned directly upon the component.

BRIEF DESCRIPTION OF THE DRAWING

The above and other objects, features and advantages of the present invention will now be described in more detail with reference to the accompanying drawing in which:

FIG. 1 is a side-elevational view of a semiconductor device with a conventional heat sink attached thereon;

FIG. 2 is a side-elevational view of a semiconductor device having attached thereon a first embodiment of a heat sink according to the present invention;

FIG. 3 is a side-elevational view of a second embodiment of a heat sink according to the present invention;

FIG. 4 is a side-elevational view of a third embodiment of a heat sink according to the present invention; and FIG. 5 is a vertical section through a casing according to the present invention for use with at least one electric and/or electronic device.

DETAILED DESCRIPTION OF PREFERRED EMBODIMENTS

Throughout all the Figures, same or corresponding elements are generally indicated by same reference numerals.

Turning now to the drawing, and in particular to FIG. 1, there is shown a side-elevational view of a semiconductor device 2 which is formed by a semiconductor chip 3 having a first surface which includes printed components interconnected to one another to form an integrated circuit 4. The semiconductor device 2 is mechanically and electrically connected to a printed circuit board 6 via electrically conductive pathways 5. Although FIG. 1 shows only two pathways 5, in symbolic representation, persons skilled in the art will understand that the number of pathways 5 depends on the application at hand and thus should not be limited to two. Also, the printed circuit board 6 may certainly include additional electric and/or electronic devices which are not shown however for ease of illustration.

Secured to the semiconductor device 2 is a conventional cooling apparatus or heat sink 1 which is provided with cooling ribs, cooling knobs or similar formed areas, as shown by dashed line in FIG. 1 and designated by reference numeral 8, to enlarge the surface of the heat sink 1. These formed areas 8 may be made through mechanical or chemical treatment of the heat sink 1.

Turning now to FIG. 2, there is shown a side-elevational view of the semiconductor device 2 which has attached thereon a first embodiment of a heat sink 100 according to the present invention. It will be appreciated by persons skilled in the art that the heat sink 100 may be secured to any surface from which heat is intended to be carried away and is thus not limited to semiconductor chips as shown by way of example in FIG. 2. Such surfaces may for example include exterior walls of casings for electric and/or electronic devices; However, the heat sink 100 according to the invention is preferably affixed to the electric and/or electronic device itself. Persons skilled in the art will further understand that the invention should also not be limited to integrated circuits, as described in conjunction with FIG. 1. It is certainly possible and within the scope of the invention to incorporate on the semiconductor chip 3 single components such as power diode, power transistor or the like.

In accordance with the present invention, the heat sink 100 is formed from a material which contains an arrangement of whiskers 11. As shown in FIG. 2, the heat sink 100 is configured of two parts and includes a substrate 10 and the whiskers 11 which are grown on the substrate 10. The substrate 10 is in heat conductive connection with semiconductor device 2 (or casing) to be cooled, and thus is secured to the device 2 (or casing). Suitably, the heat sink 100 is made of a material which is the same as the material of the device 2 so that the heat sink 100 and the device 2 have matching coefficients of thermal expansion. As a result, the joint layer 7 between the heat sink 100 and the device 2 is not subject to mechanical tension when the temperature fluctuates.

As currently, most electric and/or electronic components to be cooled are typically made of semiconductor material, the heat sink 100 according to the invention is preferably also made of semiconductor material in order to satisfy the desired matching between the heat sink material and the device material. Therefore, the material of the substrate 10 and the material of the whiskers 11 is a semiconductor material, whereby in principle any suitable semiconductor material is applicable such as for example silicon (Si), germanium (Ge), gallium arsenide (GaAs) or the like.

The type of attachment and manner of attachment of the heat sink 100 to the device 2 can be done in any desired fashion and may include all known methods such as bonding, gluing etc. Suitably, the heat sink 100 is secured eutectically onto the semiconductor device 2 so that the joint 7 is made from a eutectic. When forming the heat sink 100 from silicon (Si), the eutectic joint 7 is produced by initially coating the device proximate surface of the heat sink 100 or the heat sink proximate surface of the device 2 with a metal, e.g. gold (Au), which forms with silicon a eutectic. Subsequently, the device 2 and heat sink 100 are heated at least in the area of their adjoining surfaces at the eutectic temperature, which in the selected example gold (Au)—silicon (Si) is at approx. 400° C., placed upon one another and rubbed to one another. Gold (Au) and silicon (Si) blend with one another and form a eutectic which reliably joins the heat sink 100 and the device 2 after cooling down.

The use of a eutectic for adjoining the heat sink 100 and the device 2 has the advantage that both components need to be heated only to a relatively low temperature (in the selected example 400° C.) so that both components are only insignificantly subjected to stress during joining procedure. A further advantage is the particularly good thermic coupling between the heat sink 100 and the device 2 as realized by means of a eutectic to thereby effect a particularly efficient radiation of lost heat from the device 2 being cooled.

Whisker, as used herein, is the common designation for crystals in filamentary form of high strength and may be formed from, for example, metals, oxides, borides, carbides, nitrides, polytitanate, carbon, or the like (cf. RÖMPP, Chemielexikon, 9$^{th}$ expanded and revised edition, by Prof. Dr. Jürgen Falbe and Prof. Dr. Manfred Regitz, Georg Thieme Verlag Stuttgart—New York, Vol. 6, page 5039). The whiskers have a single-crystalline structure.

"Whisker", as used in the description should be understood in accordance with this commonly known meaning, i.e. the whiskers according to the invention can be formed basically from all materials known for formation of whiskers. As already stated, a particular preferred embodiment of the invention is the formation of the whiskers 11 from the material of the substrate 10, whereby according to a further improvement of the invention the substrate 10 as well as the whiskers 11 are formed from a semiconductor. The whiskers 11 are thus single crystalline semiconductors which project outwards, like cooling ribs, from at least a free surface of the substrate 10.

"Substrate", as used conventionally and in the description in conjunction with the whisker production, means any suitable material which promotes whisker growth and whisker nucleation, and has a surface capable of allowing growth of the whiskers. Conventionally, substrate materials include heat-resistant materials such as aluminum oxide or aluminum silicate which can also be utilized to implement the subject matter of the present invention. More details about processes for growing whiskers are described, for example, in the publication "Whisker Technology", New York 1970, by A. P. Levitt, publishing house Wiley-Interscience.

The whiskers 11 may have a diameter d in the range of 0.1–10 $\mu$m, preferably in the range from 3–5 $\mu$m, and a length l which is not limited to any ranges; However, it should be taken into account that whiskers 11 of increasing length l can more easily break as a result of mechanical impacts. Practice has shown that whiskers 11 with a ratio of length l to diameter d of greater than 10 are preferred. Although FIG. 2 shows all whiskers 11 of a same length l, it is certainly within the scope of the invention to provide the individual whiskers 11 of different length in any suitable manner.

The purpose of the whiskers 11 is the enlargement of the surface of the heat sink 100 and the creation of a greater transition surface between the heat sink 100 and the ambient atmosphere. Whiskers 11 exhibit a particularly large surface in comparison to their mass so that the accomplished, significant enlargement of the surface is associated with a very slight, essentially negligible, increase of mass. This results, advantageously, in a reduced need for additional material, on the one hand, and in a small overall weight of the heat sink 100, on the other hand, so that the overall weight of the electric/electronic device which incorporates the device 2 to be cooled is only slightly increased.

Whiskers as well as processes for their production are generally known in the art. The production of the whiskers 11 for use in a heat sink 100 according to the invention may be realized by any of the known processes. For example, a preferred process for making the whiskers 11 includes the VLS process (Vapor-Liquid-Solid process) which is disclosed in the publication "Transactions of the Metallurgical Society of AIME, vol. 233, June 1965, pages 1053–1064". According to this crystal growth process, the material to be crystallized is absorbed from the gas phase of a metal which is applied in a predetermined amount on the substrate and in which the material to be crystallized is dissolved and which is designated as agent. During the separation an alloy is formed with the material to be crystallized at a respectively preset temperature which alloy saturates during progressive separation of this material, resulting in an oversaturation and depositing of the material on the substrate and eventually to a growth of the whiskers with the liquid agent on their peaks.

The crystal growth is thereby strongly anisotropic, i.e. it is realized primarily in a direction perpendicular to the substrate surface because the absorption of the crystallized material and its components from the gas phase is realized preferably on the free surface of the liquid metal phase only at the interface between droplet and substrate.

Advantageously, the VLS process leads to whiskers covering a large surface, so that the manufacture of the heat sink 100 including the whiskers 11 can be realized in a cost-efficient manner.

Another process for making the whiskers 11 is the so-called reactive ion etching with side wall passivation, as described, for example, in the technical book "VLSI Technology, sec. Ed by S. M. Sze, McGraw-Hill International editions, New York, N.Y. 1988, pages 200–204".

Turning now to FIG. 3, there is shown a side-elevational view of a second embodiment of a heat sink 100 according to the present invention, including a cup-shaped cover 15 which is secured to the substrate 10 and envelops all whiskers 11 of the heat sink 100. Thus, a closed space 16 is formed between the substrate 10 and the cover 15 and filled, at least partially, with a liquid 17 such as, for example, water or alcohol. The heat transmission resistance from the whiskers 11 to the liquid 17 is significantly lower than in the heat transmission resistance from the whiskers 11 to air so that the heat transmission from substrate 10 and whiskers 11 can be significantly improved by the heat sink 100 according to FIG. 3.

It is certainly possible to so configure the cover 15 as to surround only a portion of the whiskers 11, while the other portion of the whiskers 11 projects directly out into the ambient air. The advantage stated above in conjunction with the improved heat transfer then applies only for a part of the substrate 10 and the whiskers 11. The cover 15 is for example formed of a same material as the substrate 10 and can be attached to the substrate 10 through bonding or by means of a eutectic.

Referring now to FIG. 4, there is shown a side-elevational view of a preferred variation of the heat sink 100 of FIG. 3. The device 2 to be cooled is secured to a first zone 18 of the heat sink 100 while a further zone 19 of the heat sink 100 is so configured as to be coolable, e.g. through the arrangement of a fan 20 in the further zone 19. Other options for cooling the zone 19 of the heat sink 100 are cooling conduits for conducting a coolant, or conventional solid, metallic heat sinks. The heat sink 100 according to the invention can thus be operated as "heat pipe" which are principally known in the art to provide a particular efficient transfer of heat generated by a device 2 and are formed by a fluid-tight envelope which is partially filled with liquid. The device 2 to be cooled is thereby arranged in the first zone 18 of the heat pipe, with the generated heat evaporating the liquid in the first zone 18. This vapor moves to the further, cooled zone 19 of the heat pipe for condensation, with heat radiating into the surrounding environment during this condensation. In order to return the condensed liquid into the first zone 18 of the heat pipe, the envelope accommodates a porous structure having pores conducting the liquid into the first zone 18 as the result of a capillary effect. Said porous structure is formed in the novel and inventive heat sink 100 of FIG. 4 by the whiskers 11 which are grown in such close proximity next to one another as to realize the described capillary effect.

Turning now to FIG. 5, there is shown a vertical section through a casing 12 according to the present invention for use with at least one electric and/or electronic device 2, with a heat sink 100 according to FIG. 2 being secured to the device 2. The casing 12 is formed as hollow body, for example, as hollow block, having an interior space 13 for accommodating the device 2. The casing 12 may be dimensioned for receiving a single device 2 or receiving a plurality of devices 2 which, optionally, are electrically connected to one another.

The casing 12 has a casing wall formed with an opening 14 for receiving the heat sink 100 in its entirety. Although the heat sink 100 is shown in a configuration according to FIG. 2, other configurations of the heat sink may certainly be applicable here for securement in the casing 12, for example, also a conventional metallic heat sink with or without cooling ribs. However, the arrangement of a heat sink 100 shown in FIGS. 2 to 4 and formed from a material including whiskers 11 is preferred.

The mechanical securement of the heat sink 100 in the opening 14 may be realized, for example, by means of a press fit or bonding. In order to avoid the application of a second glue layer and the associated material costs and manufacturing costs, the joint 7 which must be provided in any event between the heat sink 100 and the device 2 may be used to join the heat sink 100 and the device 2, as this is shown in FIG. 3.

Persons skilled in the art will understand that the application of the joint 7 and for securement of the heat sink 100 into the opening 14 is also possible when the joint 7 is a eutectic as described above in more detail. Also, it is within the scope of the present invention to arrange the heat sink 100 only partially within the opening 14, that is e.g. only the whiskers 11 (or cooling ribs in the event a conventional heat sink is involved here) are arranged inside the opening.

While the invention has been illustrated and described as embodied in a heat sink for electric and/or electronic devices, it is not intended to be limited to the details shown since various modifications and structural changes may be made without departing in any way from the spirit of the present invention.

What is claimed as new and desired to be protected by Letters Patent is set forth in the appended claims:

1. A heat sink assembly for eliminating heat generated by a heat-producing device, comprising:

a heat sink having a substrate in heat conductive connection with the device and means, depending from the substrate, for enlargement of the transition surface between the heat sink and the ambient atmosphere, said means being formed by whiskers; and a cover affixed to the substrate and at least partially surrounding the whiskers, said substrate and said cover forming a space which is filled at least partially with a liquid.

2. The heat sink assembly of claim 1 wherein the device is at least one member selected from the group consisting of electrical component, electronic component, semiconductor chip, integrated circuit, and casing for electrical and electronic components.

3. The heat sink assembly of claim 1 wherein the device is made of a material and said heat sink is made of a material, said material of the heat sink being identical to the material of the device.

4. The heat sink assembly of claim 1, wherein the whiskers grow on the substrate.

5. The heat sink assembly of claim 4 wherein the substrate is made from a semiconductor material, and the whiskers are made of semiconductor material.

6. The heat sink assembly of claim 1 wherein the whiskers have a length and a diameter, with the ratio of the length to the diameter being greater than 10.

7. The heat sink assembly of claim 1 wherein the liquid is selected from the group consisting of water and alcohol.

8. The heat sink assembly of claim 1 wherein the heat sink has a first zone for attachment of the device, and a second zone which is capable of being cooled.

9. The heat sink assembly of claim 8, and further comprising a fan positioned on the second zone.

10. The heat sink assembly of claim 1 wherein the device is a semiconductor chip, said heat sink being affixed eutectically upon the semiconductor chip.

\* \* \* \* \*